United States Patent
Robello et al.

(10) Patent No.: US 9,541,829 B2
(45) Date of Patent: *Jan. 10, 2017

(54) CROSS-LINKABLE FLUORINATED PHOTOPOLYMER

(71) Applicant: Orthogonal, Inc., Rochester, NY (US)

(72) Inventors: Douglas Robert Robello, Webster, NY (US); Charles Warren Wright, Fairport, NY (US)

(73) Assignee: Orthogonal, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/335,406

(22) Filed: Jul. 18, 2014

(65) Prior Publication Data

US 2015/0030981 A1 Jan. 29, 2015

Related U.S. Application Data

(60) Provisional application No. 61/857,849, filed on Jul. 24, 2013.

(51) Int. Cl.
   G03F 7/004 (2006.01)
   G03F 7/038 (2006.01)
   (Continued)

(52) U.S. Cl.
   CPC .......... *G03F 7/0388* (2013.01); *C08F 220/18* (2013.01); *C08F 220/22* (2013.01); *C08F 220/24* (2013.01); *C08F 222/18* (2013.01); *G03F 7/0007* (2013.01); *G03F 7/0045* (2013.01); *G03F 7/0046* (2013.01); *G03F 7/0048* (2013.01); *G03F 7/038* (2013.01); *G03F 7/32* (2013.01); *G03F 7/40* (2013.01);
   (Continued)

(58) Field of Classification Search
   CPC .......... G03F 7/0388; G03F 7/30; G03F 7/32; G03F 7/40; G03F 7/0045; G03F 7/0046; C08F 220/18; C08F 220/24; C08F 220/22; C08F 222/18; C08F 2222/185; H01L 21/0274
   USPC ..... 430/270.1, 322, 325, 329, 330, 331, 913
   See application file for complete search history.

(56) References Cited

U.S. PATENT DOCUMENTS 5,250,395 A 10/1993 Allen et al.
5,286,803 A 2/1994 Lindsay et al.
(Continued)

FOREIGN PATENT DOCUMENTS

EP 0 430 722 A2 12/1990
WO WO 03/075093 A1 9/2003
(Continued)

OTHER PUBLICATIONS

U.S. Appl. No. 14/291,692, filed May 30, 2014.
(Continued)

*Primary Examiner* — Amanda C Walke
(74) *Attorney, Agent, or Firm* — Merchant & Gould P.C.

(57) ABSTRACT

A photosensitive composition comprises a fluorinated solvent, a photo-acid generator and a copolymer. The copolymer comprises at least three distinct repeating units, including a first repeating unit having a fluorine-containing group, a second repeating unit having an acid-catalyzed cross-linkable group, and a third repeating unit having a sensitizing dye. The composition is useful in the fabrication of electronic devices, especially organic electronic and bioelectronic devices.

19 Claims, 3 Drawing Sheets

(51) Int. Cl.
  *G03F 7/32* (2006.01)
  *C08F 220/18* (2006.01)
  *H01L 21/027* (2006.01)
  *C08F 222/18* (2006.01)
  *G03F 7/40* (2006.01)
  *C08F 220/22* (2006.01)
  *C08F 220/24* (2006.01)
  *G03F 7/00* (2006.01)

(52) U.S. Cl.
  CPC ..... *H01L 21/0274* (2013.01); *C08F 2222/185* (2013.01)

(56) References Cited

U.S. PATENT DOCUMENTS

| | | | |
|---|---|---|---|
| 5,650,456 | A | 7/1997 | Yun et al. |
| 5,701,055 | A | 12/1997 | Nagayama et al. |
| 5,994,430 | A | 11/1999 | Ding et al. |
| 6,136,498 | A | 10/2000 | Jagannathan et al. |
| 6,693,296 | B1 | 2/2004 | Tyan |
| 7,029,945 | B2 | 4/2006 | Veres et al. |
| 7,632,630 | B2 | 12/2009 | Mori et al. |
| 7,858,970 | B2 | 12/2010 | Shukla et al. |
| 7,892,720 | B2 | 2/2011 | Eriguchi et al. |
| 8,334,456 | B2 | 12/2012 | Zhu et al. |
| 8,338,529 | B2 | 12/2012 | Hoshino et al. |
| 8,404,844 | B2 | 3/2013 | Kastler et al. |
| 8,411,489 | B2 | 4/2013 | Shukla et al. |
| 8,765,356 | B2 * | 7/2014 | Green et al. ............... 430/270.1 |
| 8,936,900 | B2 * | 1/2015 | Jain et al. ................. 430/270.1 |
| 2002/0161068 | A1 | 10/2002 | Watanabe et al. |
| 2003/0175002 | A1 | 9/2003 | Andrews et al. |
| 2003/0215735 | A1 | 11/2003 | Wheland et al. |
| 2005/0196969 | A1 | 9/2005 | Gunner et al. |
| 2009/0130591 | A1 | 5/2009 | Yao et al. |
| 2009/0263588 | A1 | 10/2009 | Kakino |
| 2010/0289019 | A1 | 11/2010 | Katz et al. |
| 2011/0159252 | A1 * | 6/2011 | Ober et al. ................. 428/195.1 |
| 2012/0301828 | A1 | 11/2012 | Tachibana et al. |
| 2014/0127625 | A1 * | 5/2014 | Defranco et al. .......... 430/270.1 |
| 2014/0322656 | A1 * | 10/2014 | Wright et al. ................ 430/325 |
| 2014/0356788 | A1 * | 12/2014 | Wright et al. .............. 430/285.1 |
| 2015/0132699 | A1 * | 5/2015 | Robello et al. ............ 430/285.1 |

FOREIGN PATENT DOCUMENTS

| | | |
|---|---|---|
| WO | WO 2012/148884 A2 | 4/2012 |
| WO | WO 2013/018986 A1 | 2/2013 |

OTHER PUBLICATIONS

U.S. Appl. No. 61/857,890, filed Jul. 24, 2013.
International Search Report and Written Opinion for Application No. PCT/US2014/047800 mailed Nov. 25, 2014.

* cited by examiner

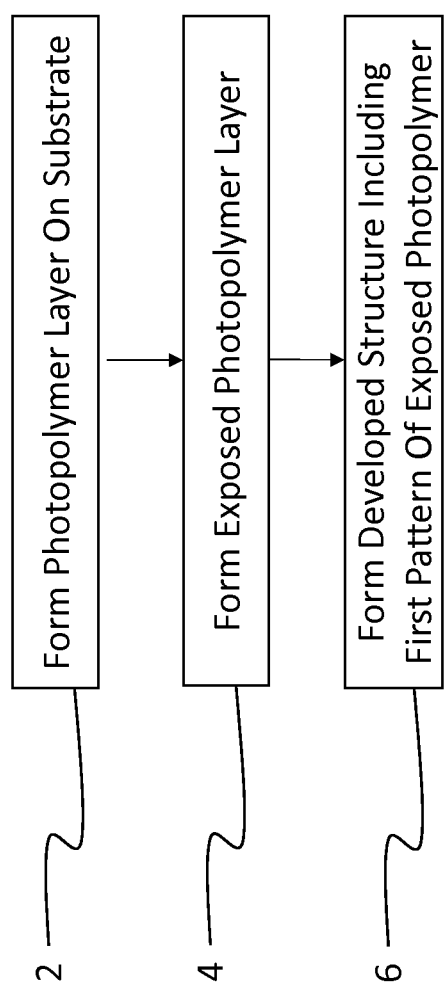

CROSS-LINKABLE FLUORINATED PHOTOPOLYMER

CROSS REFERENCE TO RELATED APPLICATIONS

The present application claims the benefit of U.S. Provisional Application No. 61/857,849, filed Jul. 24, 2013, which is incorporated herein by reference.

STATEMENT REGARDING FEDERALLY-SPONSORED RESEARCH OR DEVELOPMENT

This invention was made with Government support under SBIR Phase II Grant No. 1230454 awarded by the National Science Foundation (NSF). The government may have certain rights in the invention.

BACKGROUND

1. Field of the Invention

The present invention relates to fluorinated photopolymers having a cross linking group and a photosensitizer incorporated into the polymer. Such photopolymers are particularly useful in organic electronic and bioelectronic devices.

2. Discussion of Related Art

Photocurable polymeric compositions have many possible commercial applications. They can be used as photoresists, dielectrics, insulators, semiconductors, encapsulants, inert overcoats, water or oil repellent layers, light blocking or emitting layers, paints, printing inks and the like. Certain photocurable polymeric compositions are of particular use in the fabrication of organic electronic devices, including bioelectronic devices.

Organic electronic devices may offer certain performance and price advantages relative to conventional inorganic-based devices. As such, there has been much commercial interest in the use of organic materials in electronic device fabrication. Specifically, organic materials such as conductive polymers can be used to manufacture devices that have reduced weight and drastically greater mechanical flexibility compared to conventional electronic devices based on metals and silicon. Further, devices based on organic materials are likely to be significantly less damaging to the environment than devices made with inorganic materials, since organic materials do not require toxic metals and can ideally be fabricated using relatively benign solvents and methods of manufacture. Thus, in light of these superior weight and mechanical properties, and particularly in light of the lowered environmental impact in fabrication and additionally in disposal, electronic devices based on organic materials are expected to be less expensive than devices based on conventional inorganic materials.

One problem facing bioelectronic and organic electronic devices is that the materials and patterning processes used for conventional inorganic electronics are often not compatible with biological and organic electronic materials. Thus, new patterning materials and processes are needed.

For example, although the use of photoresists is routine in the patterning of traditional electronic devices based on inorganic materials, photolithographic patterning has been difficult when applied to biological or organic electronic materials. Specifically, biological and organic electronic materials are often much less resistant to the solvents that are used for conventional photolithography, as well as to the intense light sources that are used in these processes, with the result that conventional lithographic solvents and processes tend to degrade bioelectronic and organic electronic devices. Although there have been various attempts to overcome these problems, e.g., by ink-jet printing or shadow mask deposition, these alternative methods do not produce the same results as would be obtained with successful photolithography. Specifically, neither ink-jet printing nor shadow mask deposition can achieve the fine pattern resolutions that can be obtained by conventional lithography.

US 2011/0159252 discloses a useful method for patterning organic electronic materials by an "orthogonal" process that uses fluorinated solvents and fluorinated photoresists. The fluorinated solvents have very low interaction with organic electronic materials Although the orthogonal process has made good progress, these fluorinated systems do not always have sufficient sensitivity to typical exposing radiation, especially in the range of 300 to 450 nm. Conventional photoresist compositions may include a photosensitizing additive, commonly referred to as a sensitizer or sensitizing dye, to increase the photosensitivity of the photoresist at a particular wavelength. By varying the amount of sensitizer added to the photoresist, the photo speed and spectral sensitivity of the system can be modulated. An important technical limitation of most existing sensitizers is that they are not highly soluble in fluorinated coating solvents or fluorinated developing solutions. Consequently, the concentration of sensitizer that can be employed in fluorinated photoresist composition is very limited and development can leave behind a residue of the sensitizer. Secondly, some sensitizers are susceptible to sublimation during the baking process, thereby depleting the photoresist formulation of sensitizer. In addition, the sublimed sensitizer can coat the baking tools and then flake off during the subsequent processing, resulting in further problems in the system.

Electronic devices may require an insulating or dielectric layer (e.g., $SiO_2$ or spin-coated polymers). Here again, typical insulating or dielectric materials are often not compatible with sensitive bioelectronic and organic electronic material layers. Further, if a dielectric photopolymer is sensitized with a small molecule sensitizer, the small molecule sensitizer might leach into the active organic or biological material and negatively impact device performance.

In light of the above, there is a need to provide a more effective sensitization of photopolymers, and in particular, photopolymers that are compatible in bioelectronic and organic electronic devices.

SUMMARY

In accordance with the present disclosure, a photosensitive composition comprises: a fluorinated solvent; a photo-acid generator; and a copolymer comprising at least three distinct repeating units, including a first repeating unit having a fluorine-containing group, a second repeating unit having an acid-catalyzed cross-linkable group, and a third repeating unit having a sensitizing dye.

In accordance with another aspect of the present disclosure, a method of patterning a device, comprises: forming a photopolymer layer on a device substrate, the photopolymer layer including a photo-acid generator and a copolymer, wherein the copolymer comprises at least three distinct repeating units, including a first repeating unit having a fluorine-containing group, a second repeating unit having an acid-catalyzed cross-linkable group, and a third repeating unit having a sensitizing dye; exposing the photopolymer layer to patterned radiation to form an exposed photopolymer layer; and contacting the exposed photopolymer layer with a developing agent to remove unexposed photopolymer, thereby forming a developed structure having a first pattern of exposed photopolymer covering the substrate and a complementary second pattern of uncovered substrate corresponding to the unexposed photopolymer.

In accordance with another aspect of the present disclosure, an article comprises a layer of a copolymer having at least three distinct repeating units, including a first repeating unit having a fluorine-containing alkyl group, a second repeating unit having an alkyl ether group that is cross linked to an alkyl ether group of another second repeating unit, and a third repeating unit having a sensitizing dye that has a light absorption peak in a range of 300 to 450 nm, wherein the copolymer has a total fluorine content in a weight range of 15 to 60%.

In an embodiment, the compositions of the present disclosure have improved light sensitivity relative similar compositions without the third monomer, thereby requiring less exposure energy. When used to pattern other light-sensitive materials, the reduced light exposure may reduce possible degradation. In an embodiment, the improved light sensitivity may further enable reducing the amount of photo-acid generator. In an embodiment, incorporation of the sensitizing dye into the copolymer may overcome solubility problems of related, small molecule sensitizing dye compounds that are otherwise difficult to incorporate into the system in effective amounts. In an embodiment, cross-linked thin films of the composition have high resistance to solvents.

BRIEF DESCRIPTION OF DRAWINGS

FIG. 1 is a flow chart depicting the steps in an embodiment of the present disclosure;

DETAILED DESCRIPTION

Figure 2A:
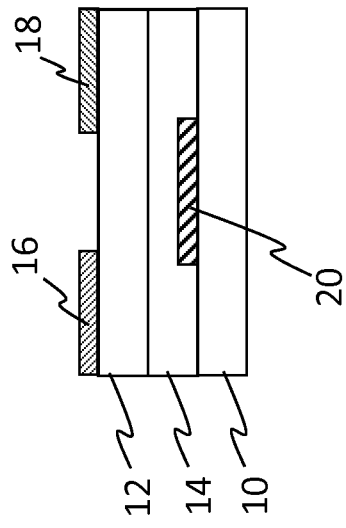
FIG. 2A is a cross-sectional view of a bottom gate/bottom contact organic thin film transistor according to an embodiment of the present disclosure.

It is to be understood that the attached drawings are for purposes of illustrating the concepts of the invention and may not be to scale.

A photosensitive composition (also referred to herein as a photopolymer composition) includes a light-sensitive material that can be coated or applied in some way to produce a photocurable film, e.g., a photo-patternable film. In an embodiment, photopolymers of the present disclosure may be used as a photoresist to pattern a layer of some useful material in a device, e.g., a multilayer electronic device, and the photopolymer may optionally be removed (stripped). In an embodiment, photopolymers of the present disclosure remain as part of a device and may be used to form various layers or structures as discussed more fully below. An embodiment of the present disclosure is directed to improved fluorinated photopolymers that incorporate a sensitizer moiety as part of a copolymer. The photopolymer is particularly suited for coating and developing using fluorinated solvents. The solvents for the fluorinated photopolymer solution, the optional developing solution and optional stripping solution are each chosen to have low interaction with other material layers that are not intended to be dissolved or otherwise damaged. Such solvents and solutions are collectively termed "orthogonal". This can be tested by, for example, immersion of a device comprising the material layer of interest into the solvent or solution prior to operation. The solvent or solution is orthogonal if there is no serious reduction in the functioning of the device. Unless otherwise noted, the term "solution" is used broadly herein to mean any flowable material. Examples of "solutions" include, but are not limited to: single solvent liquids; homogeneous mixtures of a solvent with one or more other solvents, with one or more solutes, and combinations thereof; and heterogeneous or multi-phase mixtures such as emulsions, dispersions and the like.

Certain embodiments disclosed in the present disclosure are particularly suited to devices using solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronic materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix.

The photopolymer compositions of the present disclosure are provided in a coating solution that typically includes a fluorinated solvent. In an embodiment, one or more fluorinated solvents comprise at least 50% by weight of the photopolymer composition. If a deposited layer is intended to be photo-patterned, a pattern-exposed photopolymer layer can be developed using a developing solution capable of discriminating between exposed and unexposed areas. In an embodiment, the developing solution includes at least 50% by volume of a fluorinated solvent, preferably at least 90% by volume. In an embodiment, a developed (patterned) photopolymer layer may optionally be stripped using a stripping solution capable of dissolving or lifting off the exposed photopolymer. In an embodiment, the stripping solution includes at least 50% by volume of a fluorinated solvent. Depending on the particular material set and solvation needs of the process, the fluorinated solvent may be selected from a broad range of materials such as chlorofluorocarbons (CFCs), hydrochlorofluorocarbons (HCFCs), hydrofluorocarbons (HFCs), perfluorocarbons (PFCs), hydrofluoroethers (HFEs), perfluoroethers, perfluoroamines, trifluoromethyl-substituted aromatic solvents, fluoroketones and the like.

Particularly useful fluorinated solvents include those that are perfluorinated or highly fluorinated liquids at room temperature, which are immiscible with water and many organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential than PFCs and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1,1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE 7600 aka Novec™ 7600), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,3-(1,1,2,2-tetrafluoroethoxyl)benzene (HFE-978m), 1,2-(1,1,2,2-tetrafluoroethoxyl)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), and 1,1,1,2,2,3,3,4,4,5,5,6,6-tridecafluorooctane-propyl ether (TE6O-C3).

The fluorinated photopolymer composition of the present disclosure includes a fluorinated solvent and a fluorinated photopolymer material. In and embodiment, the fluorinated photopolymer material includes a copolymer comprising at least three distinct repeating units, including a first repeating unit having a fluorine-containing group, a second repeating unit having an acid-catalyzed cross-linkable group, and a third repeating unit having a sensitizing dye. In an embodiment, the copolymer has a total fluorine content in a range of 15 to 60% by weight, alternatively 30 to 60% by weight, or alternatively 35 to 55% by weight. The term copolymer includes oligomers in addition to higher MW polymers. In an embodiment, the MW of the photopolymer is at least 2500 daltons, or in another embodiment at least 5000 daltons, or in another embodiment, at least 10,000 daltons. The copolymer is suitably a random copolymer, but other copolymer types can be used, e.g., block copolymers, alternating copolymers, and periodic copolymers. The term "repeating unit" is used broadly herein and simply means that there is at least one unit, typically more than one unit, on a polymer chain. The term is not intended to convey that there is necessarily any particular order or structure with respect to the other repeating units unless specified otherwise. When a repeating unit represents a low mol % of the combined repeating units, there may be only one unit on a polymer chain. The copolymer may be optionally blended with one or more other polymers, preferably other fluorine-containing polymers. The total fluorine content of a blended polymer may suitably be in a range of 15 to 60% by weight, alternatively 30 to 60% by weight, or alternatively 35 to 55% by weight.

In an embodiment, at least one of the three specified repeat units is formed via a post-polymerization reaction. In this embodiment, an intermediate polymer (a precursor to the desired copolymer) is first prepared, said intermediate polymer comprising suitably reactive functional groups for forming one of more of the specified repeat units. For example, an intermediate polymer containing pendant carboxylic acid moieties can be reacted with a fluorinated alcohol compound in an esterification reaction to produce the specified fluorinated repeating unit. In another example, a polymer containing a suitable leaving group such as primary halide can be reacted with a sensitizing dye compound bearing a phenol moiety to form a sensitizing dye-containing repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

In an alternative embodiment, the first, second and third repeating units are formed directly by polymerization of three (or more) appropriate monomers each having a polymerizable group, rather than by attachment to an intermediate polymer. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl acetates. Although many of the embodiments below refer to polymerizable monomers, analogous structures and ranges are contemplated and within the scope of the present disclosure wherein one or more of the repeating units are formed instead by attachment to an intermediate polymer.

In an embodiment, the fluorinated photopolymer material includes a copolymer formed at least from a first monomer having a fluorine-containing group, a second monomer having an acid-catalyzed cross-linkable group, and a third monomer having a sensitizing dye. Additional monomers may optionally be incorporated into the copolymer.

The first monomer is one capable of being copolymerized with the second and third monomers and has at least one fluorine-containing group. In an embodiment, at least 70% of the fluorine content of the copolymer (by weight) is derived from the first monomer. In another embodiment, at least 85% of the fluorine content of the copolymer (by weight) is derived from the first monomer. Although the other two monomers may include fluorine, and there can be performance advantages when they do, some fluorine-containing substituents can be expensive. In certain embodiments, therefore, it is useful from a cost standpoint to rely on the first monomer for the fluorine content, rather than also preparing fluorinated second and third monomers if their substituents have high cost. In an embodiment, the first monomer is provided in a range of 30 to 90% by weight relative to the polymer, alternatively 50 to 90%, or alternatively 60 to 80%.

The first monomer includes a polymerizable group and a fluorine-containing group. Some non-limiting examples of useful polymerizable groups include acrylates (e.g. acrylate, methacrylate, cyanoacrylate and the like), acrylamides, vinylenes (e.g., styrenes), vinyl ethers and vinyl acetates. The fluorine-containing group of the first monomer or the first repeating unit is preferably an alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated photopolymer. Throughout this disclosure, unless otherwise specified, any use of the term alkyl includes straight-chain, branched and cyclo alkyls. In an embodiment, the first monomer does not contain protic or charged substituents, such as hydroxy, carboxylic acid, sulfonic acid or the like.

In a preferred embodiment, the first monomer has a structure according to formula (1):

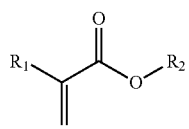
(1)

In formula (1), $R_1$ represents a hydrogen atom, a cyano group, a methyl group or an ethyl group. $R_2$ represents a fluorine-containing group, for example, a substituted or unsubstituted alkyl group having at least 5 fluorine atoms, preferably at least 10 fluorine atoms. In an embodiment, the alkyl group is a hydrofluorocarbon or hydrofluoroether having at least as many fluorine atoms as carbon atoms. In a preferred embodiment $R_2$ represents a perfluorinated alkyl or a 1H,1H,2H,2H-perfluorinated alkyl having at least 4 carbon atoms. An example of the latter would be 1H,1H, 2H,2H-perfluorooctyl (aka 2-perfluorohexyl ethyl), and a particularly useful first monomer includes 1H,1H,2H,2H-perfluorooctyl methacrylate ("FOMA") and similar materials.

Multiple "first repeating units" or "first monomers" may be used in a photopolymer, i.e., the polymer may include more than just one type of fluorine-containing group or fluorine-containing first monomer.

The second monomer is one capable of being copolymerized with the first and third monomers. The second monomer includes a polymerizable group and an acid-catalyzed cross-linkable group. Some non-limiting examples of useful polymerizable groups include those described for the first monomer. When the fluorinated photopolymer composition (e.g., as a dried layer provided on a substrate) is exposed to radiation such as UV or visible light, the acid-catalyzed cross-linkable group cross-links with an acid-catalyzed cross-linkable group from another second monomer, e.g., on another chain of copolymer. This significantly reduces its solubility relative to the unexposed regions thereby allowing development of an image with the appropriate solvent (typically fluorinated) if so desired. In an embodiment, the reduced solubility of radiation-exposed photopolymer can be used to form a permanent layer or structure in a device. In an embodiment, the second monomer is provided in a weight percentage range of 10 to 30% relative to the copolymer.

Activation of the acid-catalyzed cross-linkable group typically requires that a photo-acid generator (PAG) be added to the fluorinated photopolymer composition in some way. Commonly, this can be done by providing a small molecule additive to the solution. Alternatively, as discussed in more detail below, a PAG may be incorporated into the photopolymer, e.g., by copolymerizing a monomer having a PAG moiety. The sensitizing dye on the third repeating unit absorbs radiation such as light and forms an excited state capable of reacting with a PAG to generate an acid. The acid catalyzes the cross-linking of the acid-catalyzed cross-linkable groups from two or more second repeating units. In some cases the radiation-exposed photopolymer may need to be heated for a short time to catalyze cross-linking. Chemically amplified systems such as this can be particularly desirable since they enable the exposing step to be performed through the application of relatively low energy UV light exposure (typically under 500 mJ/cm$^2$ or preferably under 100 mJ/cm$^2$). This is advantageous since many active organic materials useful in applications to which the present disclosure pertains may decompose in the presence of UV light, and therefore, reduction of the energy during this step permits the photopolymer to be exposed without causing significant damage to underlying active organic layers. Also, decreased light exposure may be obtained by shorter exposure duration, improving the manufacturing throughput of the desired devices.

Examples of acid-catalyzed cross-linkable groups for use in the second repeating unit include, but are not limited to, cyclic ether groups and vinyloxy groups. In an embodiment, the cyclic ether is an epoxide or an oxetane. Some non-limiting examples of some acid-catalyzed cross-linkable groups include the following wherein (*) refers to an attachment site to the polymerizable group:

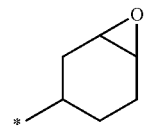
(CL-1)

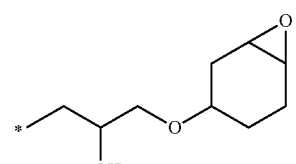
(CL-2)

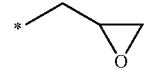
(CL-3)

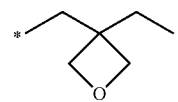
(CL-4)

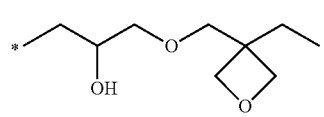
(CL-5)

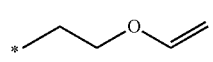
(CL-6)

Multiple "second repeating units" or "second monomers" may be used in a photopolymer, i.e., the polymer may include more than just one type of acid-catalyzed, cross-linkable group.

The third monomer is one capable of being copolymerized with the first and second monomers. The second monomer includes a polymerizable group and a sensitizing dye. Herein, the term "sensitizing dye" refers to a light-absorbing group having a photoexcited state that is capable of reacting with a PAG to generate free acid in a chemically amplified system. The sensitizing dye can be an inorganic metal complex or an organometallic, but it is preferably an organic material.

An advantage of the present disclosure is that, by incorporating the sensitizing dye into the fluorinated polymer, the dye no longer needs to be readily soluble in the coating or developing (or stripping) solvents. While a small molecule dye may have these issues, the fluorination level of the copolymer is such that it is still readily soluble, even after incorporation of the dye. Nevertheless, in some embodiments, it is useful if the third monomer includes some amount fluorination. By doing so, the level of incorporation of sensitizing dye can be further increased thereby improving the photo-speed while maintaining a wide process window for optional developing and stripping steps.

In an embodiment, third monomer has no fluorine atoms and is provided in a weight range of 1 to 10% relative to the copolymer. In another embodiment, the third monomer has no fluorine atoms and is provided in a weight range of 1 to 6% relative to the copolymer. In a preferred aspect of this embodiment, the third monomer is provided in a weight range of 1 to 4% relative to the copolymer.

In an embodiment, the third monomer includes one or more fluorine atoms (a fluorinated third monomer). The fluorine atoms can be included as part of the polymerizable group or as part of the sensitizing dye. Fluorine can be attached to an alkyl, aryl or heteroaryl moiety. In an embodiment, the third monomer has three or more fluorine atoms attached to an alkyl group. In an embodiment, a fluorinated third monomer is provided in a weight range of 1 to 20% relative to the copolymer. In another aspect of this embodiment, the fluorinated third monomer is provided in a weight range of 2 to 15% relative to the copolymer.

In an embodiment, the sensitizing dye has a light absorption peak in a range of 300 to 450 nm (as measured in a deposited film or in a fluorinated solvent solution). The term "light absorption peak" does not necessarily refer to the dye's wavelength of absolute maximum absorbance within the entire UV-VIS range. Rather it refers to any spectral peak within the range of 300 to 450 nm. That is, a sensitizing dye of the present disclosure may have a light absorption peak within the spectral range of 300 to 450 nm, but have a maximum (more intense) light absorption peak outside this range. Although other wavelengths outside the range of 300 to 450 nm can be used, this range is compatible with many of the photolithographic, mercury lamp exposure units available in the industry that use i-line, h-line or g-line exposures. Many of the fluorinated photopolymer systems of the prior art are designed for shorter wavelength radiation and have poor efficiency in this wavelength range. In an embodiment, the sensitizing dye enables sensitization of more than just i-line, h-line or g-line alone. For example, the sensitizing dye may have a light absorption peak in a range of 405 to 436 nm, and preferably, the light absorption at 405 nm is in a range of 0.33 to 3 times, preferably 0.5 to 2 times, the light absorption at 436 nm. Such a system has good sensitivity to both h-line and g-line radiation. In an embodiment, the sensitizing dye has a light absorbance of greater than 0.05, preferably greater than 0.1, at least somewhere in a range of 300 to 450 nm when the photopolymer composition is provided as a thin film.

Some non-limiting examples of useful sensitizing dye classes include dialkylaminobenzenes, diaryl ketones (e.g., benzophenones), arylalkyl ketones (e.g., acetophenones), chromanones, xanthones, thioxanthones, benzothiazoles, benzoxazoles, benzimidazoles, pyrimidines, quinolines, coumarins, psoralens, pyrromethenes, naphthalenes, anthracenes, tetracenes, pyrelenes, and pyrenes.

Some non-limiting examples of useful polymerizable coumarin-based sensitizing dyes include but are not limited to:

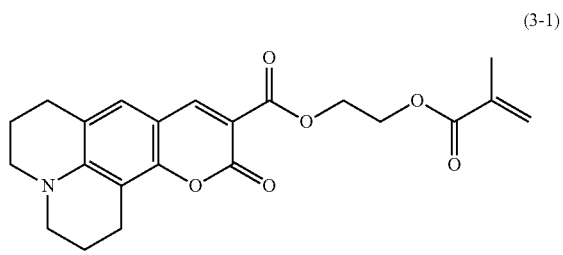

(3-1)

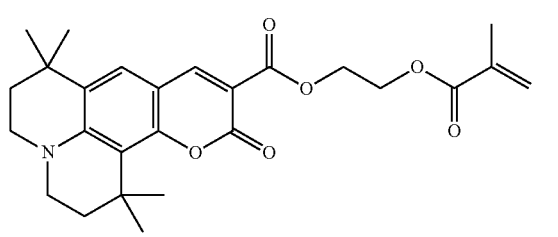

(3-2)

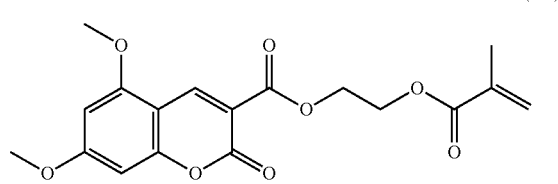

(3-3)

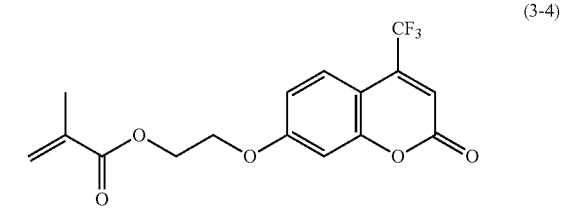

(3-4)

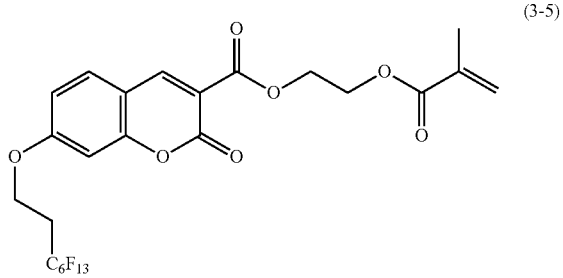

(3-5)

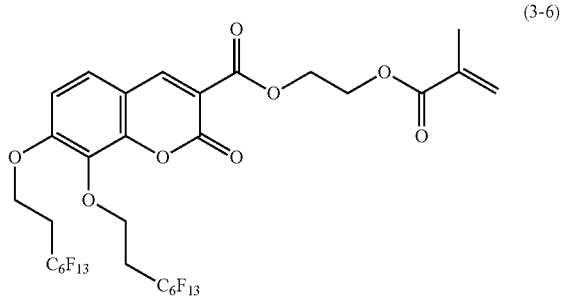

(3-6)

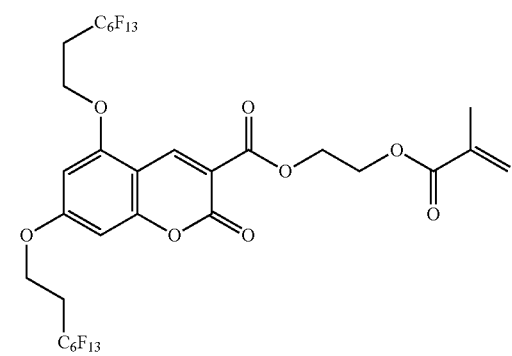
(3-7)
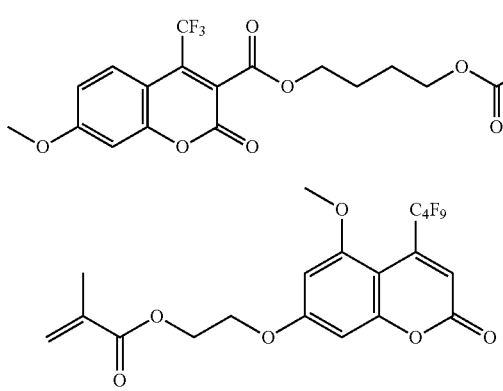
(3-8)
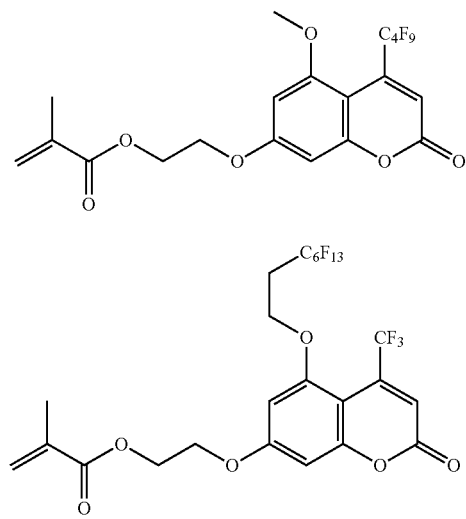
(3-9)
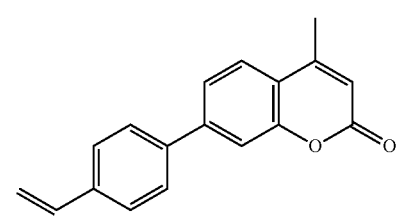
(3-10)
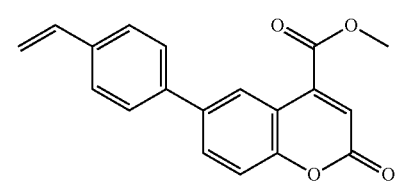
(3-11)
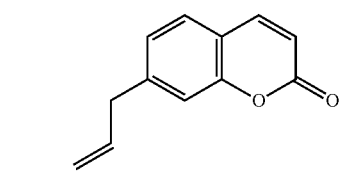
(3-12)
(3-13)
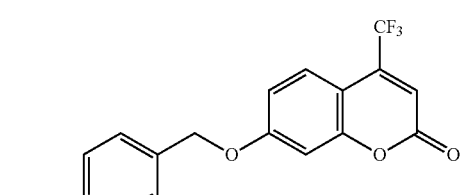
(3-14)
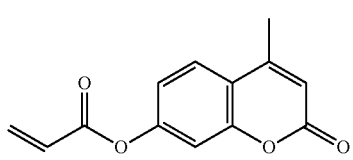
(3-15)
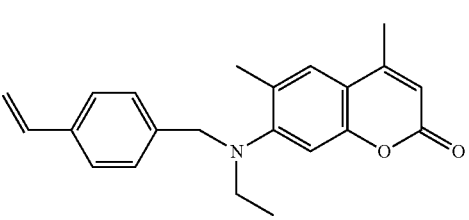
(3-16)
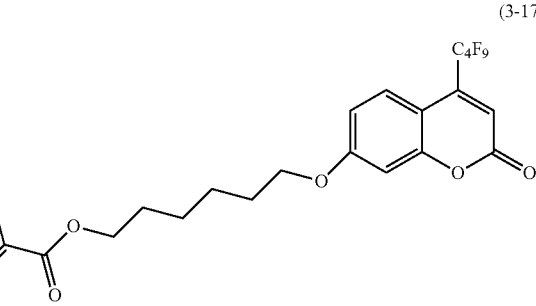
(3-17)
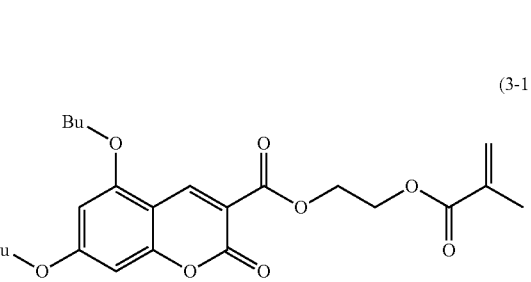
(3-18)
Some non-limiting examples of useful polymerizable anthracene-based sensitizing dyes include but are not limited to:
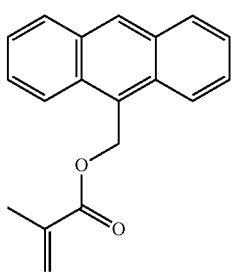
(3-19)

(3-20)
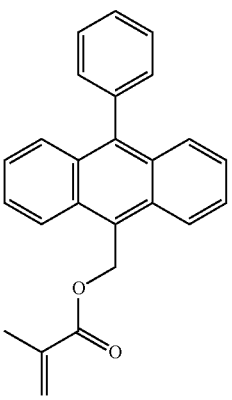

(3-21)
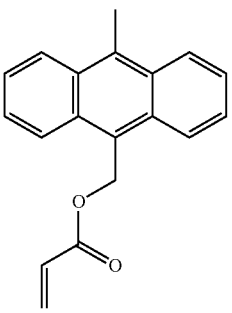

(3-22)
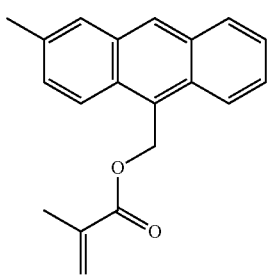

(3-23)
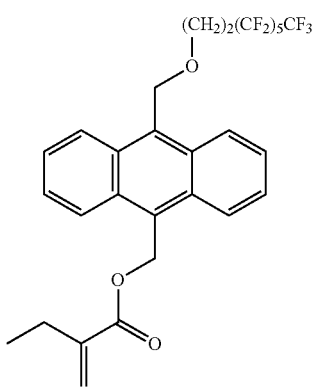

(3-24)
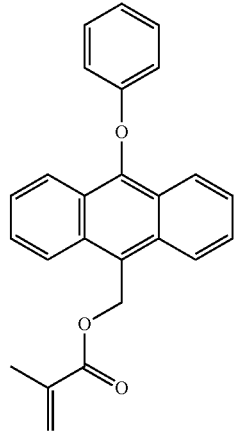

Many useful small molecule PAG compounds exist that may be added to a photopolymer composition. A small molecule PAG preferably has some solubility in the coating solvent. The amount of PAG required depends upon the particular system, but generally, will be in a range of 0.1 to 6% by weight relative to the copolymer. In an embodiment, the presence of the sensitizing dye on the third monomer substantially reduces the amount of PAG required relative to a copolymer that does not incorporate the third monomer. In an embodiment, the amount of PAG is in a range of 0.1 to 2% relative to the copolymer. Fluorinated PAGs are generally preferred and non-ionic PAGs are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate.

Some additional classes of PAGs include: triarylsulfonium perfluoroalkanesulfonates, such as triphenylsulfonium perfluorooctanesulfonate, triphenylsulfonium perfluorobutanesulfonate and triphenylsulfonium trifluoromethanesulfonate; triarylsulfonium hexafluorophosphates (or hexafluoroantimonates), such as triphenylsulfonium hexafluorophosphate and triphenylsulfonium hexafluoroantimonate; triaryliodonium perfluoroalkanesulfonates, such as diphenyliodonium perfluorooctanesulfonate, diphenyliodonium perfluorobutanesulfonate, diphenyliodonium trifluoromethanesulfonate, di-(4-tert-butyl)phenyliodonium, perfluorooctanesulfonate, di-(4-tert-butyl)phenyliodonium perfluorobutanesulfonate, and di-(4-tert-butyl)phenyliodonium trifluoromethanesulfonate; and triaryliodonium hexafluorophosphates (or hexafluoroantimonates) such as diphenyliodonium hexafluorophosphate, diphenyliodonium hexafluoroantimonate, di-(4-tert-butyl)phenyliodonium hexafluorophosphate, and di-(4-tert-butyl)phenyliodonium hexafluoroantimonate. Suitable small molecule PAGs are not limited to those specifically mentioned above. Combinations of two or more PAGs may be used as well.

Alternatively, rather than providing a PAG as a small molecule additive, it may instead be covalently attached to a polymer, either to the photopolymer (copolymer) or another polymer. In certain embodiments of the present disclosure, the photopolymer includes a photo-acid-generating repeating unit having a photo-acid generator group. Attached PAGs can have advantages over small molecule PAGs. For example, attaching the PAG reduces or eliminates potential problems that may be caused by diffusion of a small molecule (unattached) PAG into an active organic material layer. Also, by incorporating the PAG group into the fluorinated polymer, the PAG no longer needs to be as readily soluble in the coating, developing or stripping agents. While a small molecule PAG may have these issues, the fluorination level of the copolymer is such that it is still readily soluble, even after incorporation of the PAG. Nevertheless, in some embodiments, it is useful if the photo-acid-generating repeating unit includes some amount fluorination. By doing so, the level of incorporation of PAG can be further increased, thereby improving the photo-speed while maintaining a wide process window for optional developing and stripping steps. Preferably, the photo-acid generator group is non-ionic.

In another useful embodiment of an incorporated PAG, upon activation of the photo-acid generator, an acid portion (preferably a sulfonic acid) is formed that remains attached to the copolymer. In this embodiment, it is preferred that one or more of the unattached byproducts of activation (the "release portion") includes a fluorinated group.

In an embodiment, the photo-acid-generating repeating unit is incorporated into the copolymer by copolymerization of an appropriate monomer along with appropriate monomers for the first, second and third repeating units. Two non-limiting examples of useful monomers for incorporating photo-acid generator groups into a copolymer are shown below.

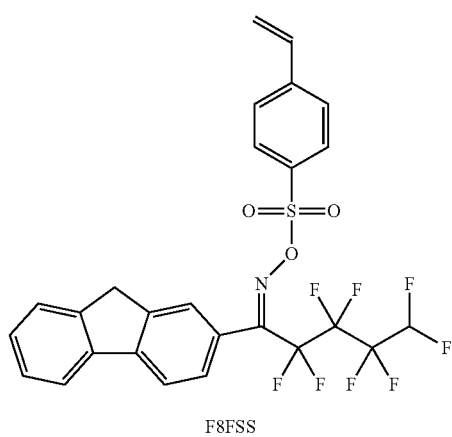

F8FSS

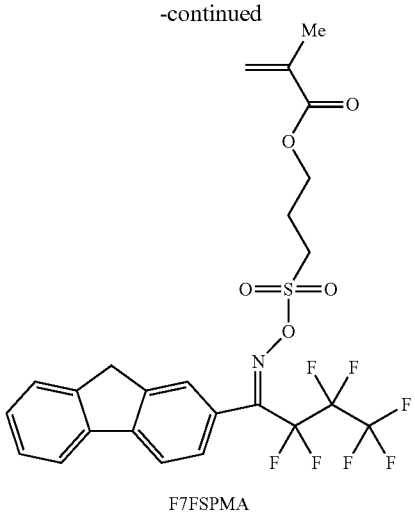

F7FSPMA

It is common in photolithography to etch patterns into layers using a "dry etchant" with the patterned photopolymer acting as an etch barrier. Herein, the term "dry etchant" is used broadly and refers to any useful gaseous material possessing energy sufficient to etch (remove) a target material. Dry etching includes, but is not limited to, glow discharge methods (e.g., sputter etching and reactive ion etching), ion beam etching (e.g., ion milling, reactive ion beam etching, ion beam assisted chemical etching) and other "beam" methods (e.g., ECR etching and downstream etching), all of which are methods known in the art. Some common dry etchants include oxygen plasma, argon plasma, UV/ozone, $CF_4$ and $SF_6$, and various combinations.

It can be advantageous, therefore, for the photopolymer to have reasonable resistance to the dry etch to ensure good pattern transfer to the underlying layer. The fluorinated photopolymer may optionally comprise a repeating unit having a dry-etch-resistant group such as polycyclic hydrocarbons. In an embodiment, the dry-etch-resistant group includes at least one dry-etch-resistant atom having an atomic weight of at least 24. In an embodiment, the dry-etch-resistant atom is Si, Ti, Ge, Al, Zr, or Sn. The dry-etch-resistant group may optionally be formed from a polymerizable monomer, e.g., one that has an organosilane, a siloxane, silazane or metalloxane group. In a preferred embodiment, the dry-etch-resistant group includes a silane or siloxane group. In certain embodiments, when a fluorinated photopolymer layer is subjected to an etching gas comprising oxygen radicals, the dry-etch-resistant group will break down to form a layer of oxide, e.g., silicon oxide (SiOx) or other metal oxide. This layer of oxide reduces the etch rate of the remaining underlying polymer and can be used to form a dielectric structure having a surface region comprising a higher density of dry-etch-resistant atoms than an interior region.

Some non-limiting examples of polymerizable monomers having a dry-etch-resistant group include those that have a structure according to formula (3):

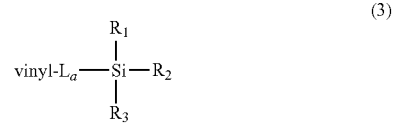

In formula (3), $R_1$ through $R_3$ are independently selected alkyl, aryl, alkoxy, aryloxy, siloxy groups, a=0 or 1, L is an optional linking group connecting a polymerizable vinyl moiety to the Si atom. The vinyl moiety may be have additional substitution so long as it is still readily polymerizable, e.g., alkyl, fluoro or cyano groups, or it may be part of a ring structure, e.g., as in norbomene or adamantane. A few non-limiting examples of such structures include:

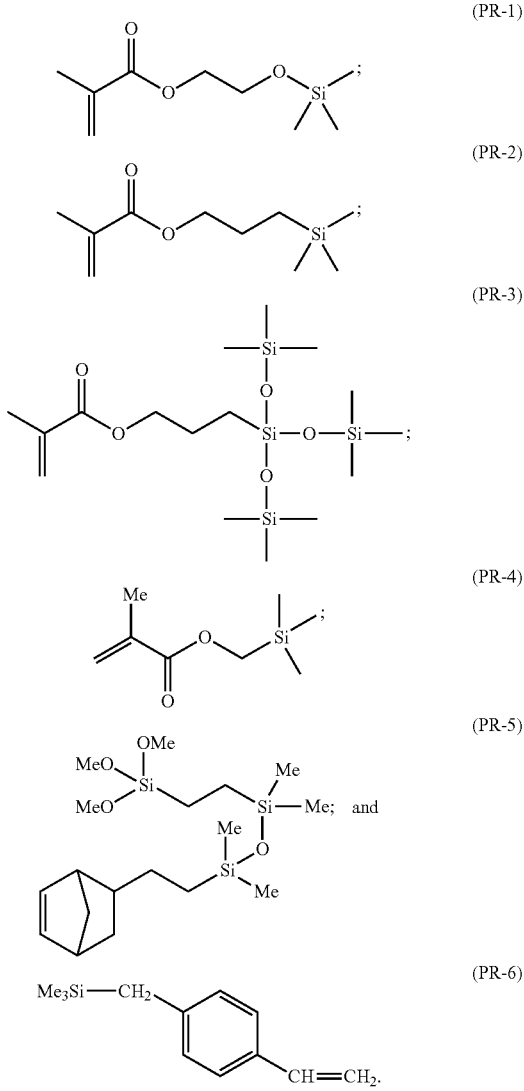

In an embodiment, the mole ratio of the dry-etch-resistant repeating unit relative to all other repeating units combined is in a range of 0.1 to 1.

The photopolymer may optionally include additional repeating units having other functional groups. For example, the copolymer may optionally include a repeating unit that adjusts some photopolymer or film property (e.g., solubility, Tg, light absorption, adhesion, surface wetting, dielectric constant, acid scavenging and the like).

Preparation and polymerization of the monomers discussed above can generally be achieved using standard synthetic methods known to a skilled artisan. Some useful examples of the preparation of orthogonal photopolymers can be found in US Publication No. 2011/0159252, PCT Publication WO2012/148884, and co-pending U.S. application Ser. No. 14/291,692, the entire contents of which are incorporated herein by reference. Examples of the preparation of polymers incorporating sensitizing dyes can be found in U.S. Pat. No. 8,338,529, U.S. Pat. No. 5,250,395, U.S. Pat. No. 7,632,630, U.S. Pat. No. 5,650,456, and U.S. Pat. No. 5,286,803, the entire contents of which are incorporated herein by reference. Examples of the preparation of polymers incorporating acid-catalyzed cross-linkable groups can be found in US Publication Nos. 2009/0263588, 2009/0130591 and 2002/0161068, the entire contents of which are incorporated by reference.

The photopolymer composition may optionally further include an unattached sensitizing dye, e.g., a small molecule, fluorinated sensitizing dye as disclosed in co-pending U.S. application 61/857,890, the contents of which are incorporated by reference. For example, the photopolymer may include an attached sensitizing dye of the present disclosure that is sensitive to i-line radiation, whereas the unattached fluorinated sensitizing dye provides sensitivity to g-line radiation (or vice versa) thereby broadening the spectral sensitivity and scope of useful exposure tools that can make use of such a photopolymer composition.

The photosensitive composition may optionally include additives such as stabilizers, coating aids, acid scavengers ("quenchers") and the like.

The fluorinated photosensitive composition of the present disclosure may be applied to a substrate using any method suitable for depositing a photosensitive liquid material. For example, the composition may be applied by spin coating, curtain coating, bead coating, bar coating, spray coating, slot die coating, dip coating, gravure coating, ink jet, flexography or the like. The composition may be applied to form a uniform film or a patterned layer of unexposed photopolymer. Alternatively, the photopolymer can be applied to the substrate by transferring a preformed fluorinated photopolymer layer (optionally patterned) from a carrier sheet, for example, by lamination transfer using heat, pressure or both. In such an embodiment, the substrate or the preformed photopolymer layer may optionally have coated thereon an adhesion promoting layer.

As previously mentioned, the composition of the present disclosure has many possible uses. Many of the uses may involve photopatterning. A flow diagram for a photopatterning embodiment of the present invention is shown in FIG. 1, and includes the step 2 of forming a photopolymer layer on a substrate. The substrate may optionally be a multilayer structure having a rigid or flexible support and one or more additional patterned or non-patterned layers. In an embodiment, the top of the substrate includes a layer of active organic material that is in contact with the photopolymer layer, either directly or via diffusion of a component of the photopolymer composition.

In step 4 the photopolymer layer is exposed to patterned radiation within the spectral sensitivity range of the sensitizing dye (e.g., light in a range of 300 nm to 450 nm), thereby forming an exposed photopolymer layer. The patterned radiation forms areas of differential developability due to some chemical or physical change caused by the radiation exposure. In the present disclosure, radiation causes the acid-catalyzed cross-linkable groups to react and cross link. Such cross linking generally reduces solubility in typical developer solutions and the photopolymer layer is a negative tone material. Patterned radiation can be produced by many methods, for example, by directing exposing light through a photomask and onto the photopolymer layer. Photomasks are widely used in photolithography and often include a patterned layer of chrome that blocks light. The photomask may be in direct contact or in proximity. When using a proximity exposure, it is preferred that the light has a high degree of collimation. Alternatively, the patterned light can be produced by a projection exposure device. In addition, the patterned light can be from a laser source that is selectively directed to certain portions of the photopolymer layer.

In step 6, a developed structure is formed that includes a first pattern of exposed photopolymer. This can be done by contacting the exposed photopolymer layer with a developing agent. In an embodiment, the developing agent includes at least 50% by volume of a fluorinated solvent, e.g., a hydrofluoroether. During development, a portion of the exposed photopolymer layer is removed in accordance with the patterned light, thus forming a developed structure having a first pattern of exposed photopolymer that covers the substrate and a complementary second pattern of uncovered substrate corresponding to the removed portion of photopolymer. By uncovered substrate, it is meant that the surface of the substrate is substantially exposed or revealed to a degree that it can be subjected to further treatments. Contacting the exposed photopolymer layer can be accomplished by immersion into a developing agent or by coating it with a developing agent in some way, e.g., by spin coating or spray coating. The contacting can be performed multiple times if necessary. The developed structure may optionally be subjected to further steps, depending on the nature of the device. For example, the structure may be treated in some way to modify a property of the uncovered substrate or exposed photopolymer, coated with an additional material layer or the exposed photopolymer may be removed. Some non-limiting examples of such further steps can be found in co-pending U.S. application Ser. No. 14/291,692, the entire contents of which are incorporated herein by reference.

Figure 2B:
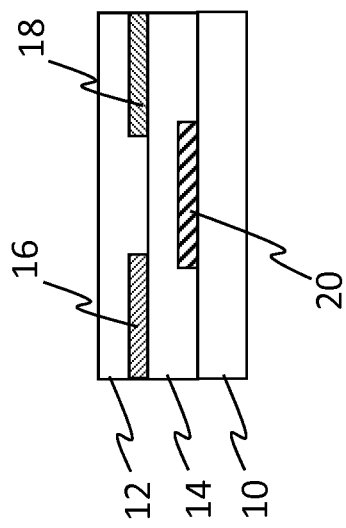
FIG. 2B is a cross-sectional view of a bottom gate/top contact organic thin film transistor according to an embodiment of the present disclosure.
Figure 2C:
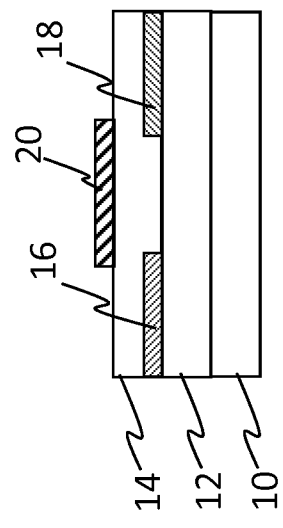
FIG. 2C is a cross-sectional view of a top gate/bottom contact organic thin film transistor according to an embodiment of the present disclosure.
Figure 2D:
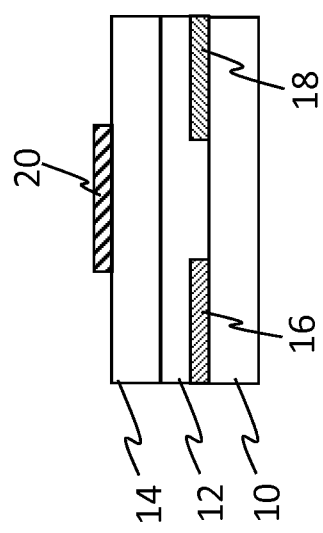
FIG. 2D is a cross-sectional view of a top gate/top contact organic thin film transistor according to an embodiment of the present disclosure.

In an embodiment, the fluorinated photopolymer of the present disclosure is used as a gate dielectric material in a thin film transistor (TFT), preferably an organic thin film transistor (OTFT). General materials and methods for making and operating OTFT devices are known to the skilled artisan, and some non-limiting examples can be found in U.S. Pat. No. 7,029,945, U.S. Pat. No. 8,404,844, U.S. Pat. No. 8,334,456, U.S. Pat. No. 8,411,489 and U.S. Pat. No. 7,858,970, the entire contents of which are incorporated by reference. FIG. 2 illustrates a few of the numerous possible embodiments, but in general, an OTFT is formed on a substrate 10 and has an organic semiconductor material layer 12, a gate dielectric material layer 14, a source electrode 16, a drain electrode 18 and a gate electrode 20. FIG. 2A shows a bottom gate/bottom contact OTFT, FIG. 2B shows a bottom gate/top contact OTFT, FIG. 2C shows a top gate/bottom contact OTFT, and FIG. 2D shows a top gate/top contact OTFT. In a preferred embodiment, the photopolymer is used as a dielectric in a top gate OTFT device. When used in displays, an array of OTFTs is typically provided in order to individually address each display pixel or sub-pixel. Although not shown in the figures, gate dielectric material layer 14 may be photopatterned as needed, for example, to provide open areas for making electrical contacts or building via structures. In addition, although not shown in the figures, the organic semiconductor material layer may be patterned so that each OTFT or display pixel/sub-pixel has its own discrete and separate organic semiconductor material. This can be accomplished by using a fluorinated photoresist and orthogonal solvent processing, e.g., as described in US 2011/0159252 and co-pending U.S. application Ser. No. 14/291,692. In another embodiment, gate dielectric material layer is formed of a bilayer having a first fluorinated polymer adjacent to the organic semiconductor layer (which may or may not be a fluorinated photopolymer according to the present disclosure) and a second fluorinated polymer spaced away from the organic semiconductor layer, the second fluorinated polymer being a fluorinated photopolymer according to the present disclosure. Use of a fluorinated polymer between an organic semiconductor material and a photoresist is disclosed in US 2010/0289019, the entire contents of which are incorporated by reference herein.

The fluorinated photopolymer of the present disclosure may be used as an electrically insulating layer in an electronic device. For example, it may act as an insulating layer in a wire, a TFT structure (besides acting as a dielectric), a touch screen, an RFID device, a sensor, a capacitor, a photovoltaic device and the like.

The present fluorinated photopolymer may be used as a partition structure that separates light-emitting areas of a display or lighting device, e.g., as described in U.S. Pat. No. 6,693,296 or in U.S. Pat. No. 5,701,055, the entire contents of both patents are incorporated by reference herein. Some examples of useful light-emitting materials include organic light-emitting materials, such as those used in OLED devices, and semiconductor nanoparticles, such as quantum dots formed from colloidal semiconductor nanocrystals, particularly III/V or II/VI semiconductors.

The present fluorinated photopolymer may be patterned to form a plurality of wells that may be used for many possible purposes, e.g., wells that are capable of containing an electronic or display material. For example, the fluorinated photopolymer may form banks and wells as described in US 2005/0196969, the entire contents of which are incorporated by reference, wherein the wells may be filled with a solution-based organic light emitting material. Such filling can optionally be by ink jet. Other display materials may be added include liquid crystal material, electrophoretic material, a semiconductor nanoparticle material, a color filter material, and the like.

Figure 3A:
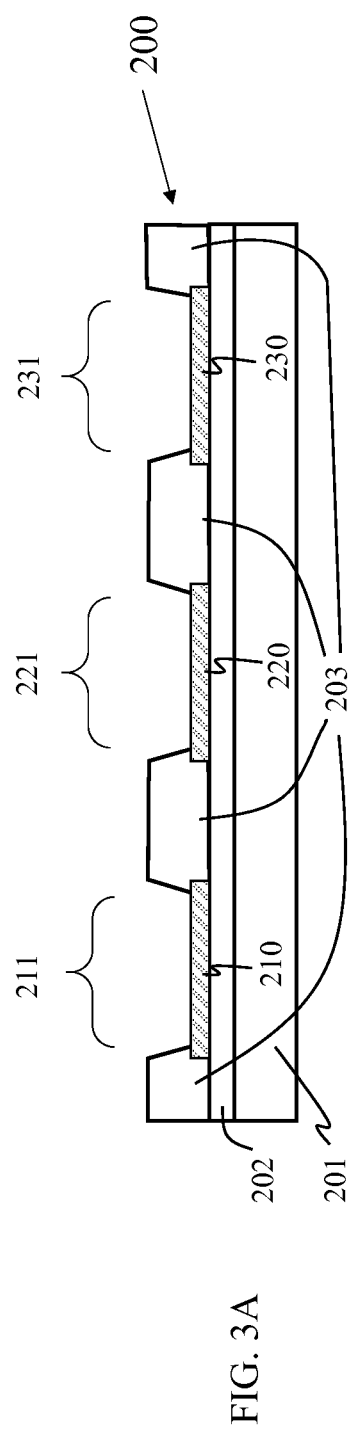
FIG. 3A is a cross-sectional view of an active matrix OLED backplane according to an embodiment of the present disclosure.
Figure 3B:
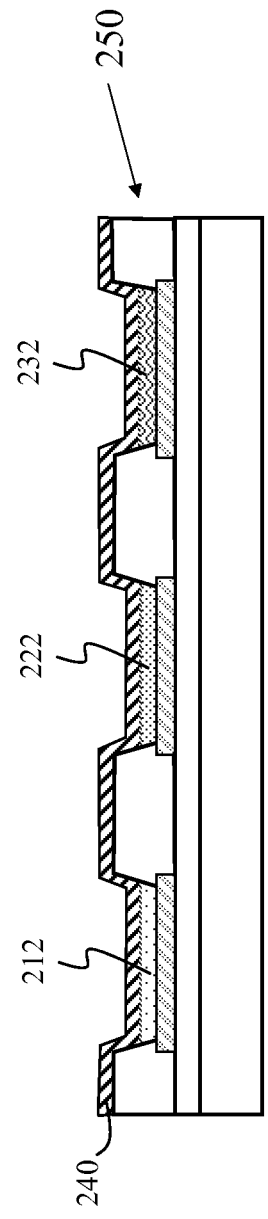
FIG. 3B is a cross-sectional view of an active matrix OLED device according to an embodiment of the present disclosure.

FIG. 3A shows an embodiment of an active matrix OLED backplane 200 having a support 201, a TFT layer portion 202 (which may include multiple layers of wiring, dielectric and semiconductor materials), a first bottom electrode 210, a second bottom electrode 220, a third bottom electrode 230 and patterned fluorinated photopolymer 203 of the present disclosure. The patterned fluorinated photopolymer forms wells 211, 221 and 231 over the bottom electrodes. The first, second and third bottom electrodes each represent one bottom electrode in a first, second and third array of bottom electrodes, respectively, all independently addressable. In FIG. 3B, an active matrix OLED device 250 is formed by providing a red-emitting organic EL medium 212 into well 211 and over the first bottom electrode 210, a green-emitting organic EL medium 222 into well 221 and over the second bottom electrode 220, a blue-emitting organic EL medium 232 into well 231 and over the third bottom electrode 230, and a common top electrode 240 over the structure.

The present fluorinated photopolymer may be used to form at least a portion of a barrier layer in a water- or solvent-sensitive device. Organic semiconductors and organic light-emitting materials in particular are often very sensitive to water. A barrier layer can be coated over a device as a single layer or as multiple layers and may optionally be part of an alternating photopolymer/inorganic oxide multi-layer barrier structure. Similarly, a bioelectronic device such as a biosensor, an ion pump, an electrochemical transistor, a drug delivery device and the like may use the present fluorinated photopolymer as one or more structural or barrier layers. In some embodiments, e.g., implantable bioelectronic devices, an outer coating may be particularly beneficial.

REPRESENTATIVE EMBODIMENTS

Some non-limiting embodiments of the present disclosure include, but are not limited to the following.

1. A photosensitive composition comprising:
a fluorinated solvent;
a photo-acid generator; and
a copolymer comprising at least three distinct repeating units, including a first repeating unit having a fluorine-containing group, a second repeating unit having an acid-catalyzed cross-linkable group, and a third repeating unit having a sensitizing dye.

2. The photosensitive composition according to embodiment 1 wherein the copolymer is formed from a first monomer having the fluorine-containing group, a second monomer having the acid-catalyzed cross-linkable group, and a third monomer having the sensitizing dye.

3. The photosensitive composition according to embodiments 1 or 2 wherein the copolymer has a total fluorine content in a range of 15 to 60% by weight.

4. The photosensitive composition according to any one of embodiments 1-3 wherein the acid-catalyzed cross-linkable group is a cyclic ether or a vinyloxy group.

5. The photosensitive composition according to embodiment 4 wherein the cyclic ether is an epoxide.

6. The photosensitive composition according to any one of embodiments 1-5 wherein the fluorine-containing group is a fluoroalkyl.

7. The photosensitive composition according to embodiment 2 wherein the first monomer is provided in a weight range of 60 to 80% relative to the copolymer.

8. The photosensitive composition according to embodiment 2 or 7 wherein the first monomer is a fluoroalkyl acrylate.

9. The photosensitive composition according to any one of embodiments 2, 7 or 8 wherein the third monomer has no fluorine atoms and wherein the third monomer is provided in a weight range of 1 to 6% relative to the copolymer.

10. The photosensitive composition according to any one of embodiments 2, 7 or 8 wherein the third monomer has one or more fluorine atoms and wherein the third monomer is provided in a weight range of 1 to 20% relative to the copolymer.

11. The photosensitive composition according to any one of embodiments 2, 7, 8, 9 or 10 wherein first, second and third monomers are all acrylates.

12. The photosensitive composition according to any one of embodiments 1-11 wherein the solvent is a hydrofluoroether.

13. The photosensitive composition according to any one of embodiments 1-12 wherein the sensitizing dye has a light absorption peak in a range of 300 to 450 nm.

14. The photosensitive composition according to any one of embodiments 1-13 wherein the photo-acid generator is non-ionic.

15. The photosensitive composition according to any one of embodiments 1-14 wherein the photo-acid generator has one or more fluorine atoms.

16. The photosensitive composition according to any one of embodiments 1-15 wherein the photo-acid generator is covalently attached to the copolymer, which further comprises a photo-acid-generating repeating unit.

17. The photosensitive composition according to embodiment 16 wherein the photo-acid-generating repeating unit is selected so that, upon activation of the photo-acid generator, an acid portion remains attached to the copolymer and a release portion includes a fluorinated group.

18. A method of patterning a device, comprising:
forming a photopolymer layer on a device substrate, the photopolymer layer including a photo-acid generator and a copolymer, wherein the copolymer comprises at least three distinct repeating units, including a first repeating unit having a fluorine-containing group, a second repeating unit having an acid-catalyzed cross-linkable group, and a third repeating unit having a sensitizing dye;
exposing the photopolymer layer to patterned radiation to form an exposed photopolymer layer; and
contacting the exposed photopolymer layer with a developing agent to remove unexposed photopolymer, thereby forming a developed structure having a first pattern of exposed photopolymer covering the substrate and a complementary second pattern of uncovered substrate corresponding to the unexposed photopolymer.

19. The method of embodiment 18 wherein the developing agent comprises at least 50% by volume of a fluorinated solvent.

20. The method of embodiment 19 wherein the fluorinated solvent is a hydrofluoroether.

21. The method of embodiment 20 wherein the hydrofluoroether is selected from the group consisting of an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200), 3-ethoxy-1,1,1,2,3,4,4,5,5,6,6,6-dodecafluoro-2-trifluoromethyl-hexane (HFE-7500), 1,1,1,2,3,3-hexafluoro-4-(1,1,2,3,3,3,-hexafluoropropoxy)-pentane (HFE 7600), 1-methoxyheptafluoropropane (HFE-7000), 1,1,1,2,2,3,4,5,5,5-decafluoro-3-methoxy-4-trifluoromethylpentane (HFE-7300), 1,3-(1,1,2,2-tetrafluoroethoxyl)benzene (HFE-978m), 1,2-(1,1,2,2-tetrafluoroethoxyl)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), and 1,1,1,2,2,3,3,4,4,5,5,6,6-tridecafluorooctane-propyl ether (TE6O-C3).

22. The method according to any of embodiments 18-21 wherein the substrate comprises a support and a layer of active organic material, and wherein the photopolymer layer is in contact with the layer of active organic material.

23. The method of embodiment 22 wherein the active organic material is an organic semiconductor or an organic light-emitting material.

24. The method according to any of embodiments 18-21 wherein the substrate comprises a support, a layer of active organic material and a layer of an intervening fluorinated polymer, wherein the photopolymer layer is in contact with the layer of intervening fluorinated polymer and spaced from the layer of active organic material.

25. The method of embodiment 24 wherein the active organic material is an organic semiconductor or an organic light-emitting material.

26. The method according to any of embodiments 18-25 wherein the first pattern of photopolymer forms at least a portion of a gate dielectric in an organic thin film transistor device.

27. The method according to any of embodiments 18-25 wherein the first pattern of photopolymer forms a partition structure that separates light-emitting areas of a display or lighting device.

28. The method of embodiment 27 wherein the display or lighting device includes at least one organic light emitting material or at least one semiconductor nanoparticle material.

29. The method according to any of embodiments 18-25 wherein the first pattern of photopolymer forms a plurality of wells capable of containing a display material.

30. The method of embodiment 29 wherein the display material is a color filter material, a liquid crystal material, an electrophoretic material, an organic light-emitting material or a semiconductor nanoparticle material.

31. The method of embodiment 30 further comprising providing the display material into one or more of the plurality of wells.

32. The method according to any of embodiments 18-25 wherein the first pattern of photopolymer forms at least a portion of a barrier layer in a water sensitive device.

33. The method according to any of embodiments 18-21 wherein the first pattern of photopolymer forms at least a portion of a barrier layer in a bioelectronic device.

34. The method according to any of embodiments 18-33 wherein the photopolymer layer is formed using any of the photopolymer compositions according to embodiments 1-17.

35. An article comprising a layer of a copolymer having at least three distinct repeating units, including a first repeating unit having a fluorine-containing alkyl group, a second repeating unit having an alkyl ether group that is cross linked to an alkyl ether group of another second repeating unit, and a third repeating unit having a sensitizing dye that has a light absorption peak in a range of 300 to 450 nm, wherein the copolymer has a total fluorine content in a range of 15 to 60% by weight.

36. The article of embodiment 35 wherein the copolymer has a total fluorine content in a range of 30 to 60% by weight.

37. The article according to any of embodiments 35 or 36, wherein the article is an organic thin film transistor device, an OLED device, a display device, a bioelectronic device or a lighting device.

Examples

Monomer Syntheses

Monomers used in the preparation of the photopolymers were obtained from commercial sources except for the following.

Preparation of TMJCMA (Compound (3-2) Above)

As a first intermediate in the preparation of monomer TMJCMA, 10,10,16,16-tetramethyl-4-oxo-3-oxa-13-azatetracyclo[7.7.1.0$^{2,7}$.0$^{13,17}$]heptadeca-1,5,7,9(17)-tetraene-5-carbonyl chloride was prepared as follows A stirred suspension of 10,10,16,16-tetramethyl-4-oxo-3-oxa-13-azatetracyclo[7.7.1.0$^{2,7}$.0$^{13,17}$]heptadeca-1,5,7,9(17)-tetraene-5-carboxylic acid (12.11 g, 35 mmol, prepared according to U.S. Pat. No. 4,736,032) and two drops of N,N-dimethylformamide in 80 mL of dichloromethane was treated under nitrogen with oxalyl chloride (4.95 g, 39 mmol). After 18 h, NMR analysis of the mixture indicated that the reaction was only partially complete. An additional 3.0 g of oxalyl chloride was added, and the mixture was heated at reflux for 4 h. Volatiles were removed in a stream of nitrogen, and the orange product was dried in vacuo.

Next, a stirred solution under nitrogen of 10,10,16,16-tetramethyl-4-oxo-3-oxa-13-azatetracyclo[7.7.1.0$^{2,7}$.0$^{13,17}$]heptadeca-1,5,7,9(17)-tetraene-5-carbonyl chloride (12.76 g, 35.5 mmol) and few mg 4,4'-thiobis(2-methyl-6-tert-butylphenol) (inhibitor) in 40 mL of α,α,α-trifluorotoluene was cooled in ice bath and treated with a solution of 2-hydroxyethyl methacrylate (5.54 g, 22.6 mmol), triethylamine (5.38 g, 53.2 mmol), and 4-dimethylaminopyridine (0.433 g, 3.6 mmol) in 40 mL of the same solvent. The mixture was gradually warmed to ambient overnight, heated at 60° C. for 4 h, and then cooled. The mixture was diluted with dichloromethane, and washed successively with 1 M aqueous hydrochloric acid and with brine. The organic layer was dried over magnesium sulfate, filtered, and concentrated. The product was purified by column chromatography on silica gel, eluting with a mixture of heptane and ethyl acetate, followed by recrystallization from isopropanol to provide 7.48 g (47% of theory) of an orange solid.

Preparation of FOCMA (Compound (3-4) Above)

As an intermediate in the synthesis of monomer FOCMA, 7-(2-hydroxyethoxy)-4-trifluoromethylcoumarin was prepared as follows. A stirred mixture of 1.79 g (7.8 mmol) of 7-hydroxy-4-trifluoromethylcoumarin, 0.75 g (8.6 mmol) of ethylene carbonate, 1.45 g (4.4 mmol) of cesium carbonate, and 30 mL of N,N-dimethylformamide was heated for 3 days under nitrogen in an 80° C. oil bath. The reaction mixture was cooled to ambient and poured into water. The precipitated crude product was collected, washed with water, and dried. After recrystallization from a mixture of toluene and heptane, 1.01 g (47% yield) of a white solid was obtained. This intermediate was characterized by $^1$H NMR: (300 MHz, CDCl3) δ 2.00 (t, 1H), 4.04 (m, 2H), 4.18 (t, 2H), 6.64 (s, 1H), 6.90-6.98 (m, 2H), 7.64 (d, 1H).

Next, a mixture of 0.012 g (0.6 mmol) of molybdenum dioxide dichloride and 1.35 g (8.8 mmol) of methacrylic anhydride was stirred in 10 mL of dichloromethane under nitrogen for 30 min. A solution of 1.60 g (5.8 mmol) of 7-(2-hydroxyethoxy)-4-trifluoromethylcoumarin was added slowly, and the mixture was stirred for 2 h. Methanol (5 mL) was added, and stirring was continued 2 h. The resulting solution was diluted with dichloromethane, and treated with 5 g of potassium carbonate. After stirring 1 h, the mixture was filtered, washed successively with water and brine, dried over magnesium sulfate, filtered, and concentrated. The residue was recrystallized from 2-propanol to obtain 1.24 g (62% yield) of a colorless powder in two crops. The product was characterized by $^1$H NMR: (300 MHz, CDCl3) δ 1.96 (s, 3H), 4.31 (t, 2H), 4.55 (t, 2H), 5.62 (m, 1H), 6.15 (s, 1H), 6.64 (s, 1H), 6.90-6.97 (m, 2H), 7.64 (dd, 1H).

Preparation of DBCMA (Compound (3-18) Above)

As a first step, 2,4-dibutoxy-6-hydroxybenzaldehyde was prepared as follows. A mixture of 2,4,6-trihydroxybenzaldehyde (7.20 g, 47 mmol, synthesized by the method of Lawrence, et al. *Organic Letters* 2010, 12(8), 1676), 1-iodobutane (17.2 g, 93 mmol), potassium carbonate (12.9 g, 93 mmol), and 75 mL of 2-butanone was stirred and heated under nitrogen for 16 h, then cooled to ambient. The reaction mixture was diluted with acetone and filtered. The filtrate was concentrated, and then partitioned between 75 mL each of diethylether and water. The aqueous layer was separated and extracted twice with diethylether. The combined ethereal extracts were washed with brine, dried over magnesium sulfate, filtered, and concentrated. The residue was distilled at reduced pressure to afford 3.15 g (25% of theory) of the product as a colorless oil.

Next, 5,7-dibutoxy-3-coumarincarboxylic acid was prepared as follows. A mixture 2,4-dibutoxy-6-hydroxybenzaldehyde (3.15 g, 12 mmol), 2,2-dimethyl-1,3-dioxane-4,6-dione (1.88 g, 13 mmol), 10 drops of piperidine, and 20 mL acetonitrile was stirred 48 h at room temperature. The precipitated product was collected, washed quickly with cold acetonitrile, and dried. A light yellow solid was obtained, mass 2.25 g (57% of theory).

As a next step, 5,7-dibutoxy-3-coumarincarbonyl chloride was prepared. A stirred solution of 5,7-dibutoxy-3-coumarincarboxylic acid (2.25 g, 7 mmol), 4 drops of N,N-dimethylformamide, and 20 mL dichloromethane at room temperature under nitrogen was treated with oxalyl chloride (1.28 g, 10 mmol). The solution was stirred for 2 h, then heated in 40° C. oil bath for 4 h. After cooling to ambient, volatiles were removed in a stream of nitrogen. The residue was recrystallized from a mixture of toluene and heptane to provide 2.06 g (87% of theory) of the product as a yellow solid.

DBCMA (2-(5,7-dibutoxy-3-coumarinylcarbonyloxy) ethyl methacrylate) was then prepared. A stirred solution under nitrogen of 5,7-dibutoxy-3-coumarincarbonyl chloride (2.07 g, 5.9 mmol) and few mg 4,4'-thiobis(2-methyl-6-tert-butylphenol) (inhibitor) in 15 mL of dichloromethane was treated with a solution of 2-hydroxyethyl methacrylate (0.92 g, 7.0 mmol), triethylamine (0.89 g, 8.8 mmol), and 4-dimethylaminopyridine (0.07 g, 0.6 mmol) in 15 mL of the same solvent. The mixture was heated at 40° C. for 4 h, and then cooled to ambient. The mixture was diluted with dichloromethane, and washed successively with 1 M aqueous hydrochloric acid and with brine. The organic layer was dried over magnesium sulfate, filtered, and concentrated. The product was purified by recrystallization from isopropanol to provide 2.26 g (86% of theory) of a light yellow solid.

Preparation of F8FSS (Structure Shown Above)

First, 4-chlorosulfonylstyrene was prepared. A stirred suspension of sodium styrene-4-sulfonate (10.0 g, 45 mmol) in 30 mL of acetonitrile was treated under nitrogen with phosphorous oxychloride (20.5 g, 134 mmol). The mixture was heated at reflux for 4 h, cooled to ambient temperature, and poured onto ice. The product was extracted into dichloromethane, then the extract was dried over magnesium sulfate and filtered. A small amount of 4,4'-thiobis(2-methyl-6-tert-butylphenol) (inhibitor) was added, then the solution was concentrated to deposit a tan oil. The product was purified by distillation at reduced pressure, collecting the fraction having a boiling point of 92-94° C. (0.5 mmHg), to provide 6.06 g (67% of theory) of a colorless oil.

Second, 2-(5H-perfluoropentanoyl)fluorene was prepared. A stirred mixture of fluorene (6.00 g, 36 mmol) and aluminum chloride (5.29 g, 40 mmol) in 25 mL of dichloromethane under nitrogen was cooled in an ice bath and treated with 5H-perfluoropentanoyl chloride (10.02 g, 38 mmol). The mixture was warmed slowly to ambient temperature, then added to ice-water. The organic layer was separated, washed successively with aqueous sodium bicarbonate and with brine, dried over magnesium sulfate, filtered through a short column of silica gel, and concentrated to deposit this intermediate as a tan oil. Yield: 14.29 g (96% of theory).

Third, 2-(5H-perfluoropentanoyl)fluorene oxime was prepared. A stirred solution of 2-(5H-perfluoropentanoyl)fluorene (14.29 g, 36 mmol) and hydroxylamine hydrochloride (6.04 g, 87 mmol) in 50 mL of denatured ethanol was treated with pyridine (17.5 mL, 217 mmol) and then heated under nitrogen in an 80° C. oil bath for 18 h. The reaction mixture was cooled to ambient temperature and concentrated a reduced pressure. The residue was partitioned between 300 mL of dichloromethane and 100 mL of 1 N hydrochloric acid. The organic layer was washed successively with water and brine, dried over magnesium sulfate, filtered, and concentrated. The residue was redissolved in 200 mL of dichloromethane and treated with a solution of 5 mL of concentrated hydrochloric acid in 45 mL of acetic acid. The mixture was stirred for 18 h at ambient temperature, and then added 200 mL of water. The organic layer was separated, washed with brine, dried over magnesium sulfate, filtered, and concentrated to deposit an off-white solid. This intermediate product was purified recrystallization from 1:1 heptane:toluene to provide 10.12 g (68% of theory).

Finally, 1-(9H-fluoren-2-yl)-5H-perfluoro-1-pentanone-O-[(4-vinylphenyl)sulfonyl]oxime was prepared. A stirred solution of 2-(5H-perfluoropentanoyl)fluorene oxime (4.00 g, 9.8 mmol) and triethylamine (1.29 g, 13 mmol) in 20 mL of dichloromethane under nitrogen was cooled in an ice bath and treated with a solution of 4-chlorosulfonylsytrene (2.38 g, 12 mmol) in 10 mL of dichloromethane. The reaction mixture was gradually warmed to ambient temperature, diluted with dichloromethane, and washed successively with water, 1 N hydrochloric acid and with brine, dried over sodium sulfate, filtered, and concentrated to deposit a tan solid. The product was purified by recrystallization from ethanol to provide 4.52 g (80% of theory).

Preparation of F7FSPMA (Structure Shown Above)

First, 3-(chlorosulfonyl)propyl methacrylate was prepared. A mixture of potassium sulfopropyl methacrylate (18.14 g, 74 mmol), N,N-dimethylformamide (1.8 g, 25 mmol), and 30 mL of anhydrous tetrahydrofuran was stirred magnetically under nitrogen while cooling in an ice bath. Thionyl chloride (29.5 mL, 405 mmol) was added dropwise. The mixture was warmed slowly to ambient temperature, then poured cautiously into ice-water (200 mL). The product was extracted into dichloromethane (2×75 mL). The combined extracts were washed with water (3×50 mL), dried over sodium sulfate, filtered, and concentrated. The oily residue was distilled at reduced pressure, collecting the product bp 92-96° C. (0.5 mmHg). The yield was 9.53 g (57% of theory).

Second, 2-heptafluorobutanoylfluorene was prepared. A solution of fluorene (8.00 g, 48 mmol) and aluminum chloride (7.06 g, 53 mmol) in 30 mL of dichloromethane was stirred magnetically under nitrogen while cooled in an ice/water bath, and treated with hephafluorobutanoyl chloride (12.31 g, 53 mmol) dropwise. The mixture was warmed slowly to ambient temperature, then quenched in ice-water. The organic layer was separated, washed successively with aqueous sodium bicarbonate and with brine, then dried over magnesium sulfate. The resulting solution was filtered through a short column of silica gel, eluting with dichloromethane. The eluate was concentrated and dried in vacuo to obtain a solid product. The yield was 17.26 g (99% of theory).

Third, 2-heptafluorobutanoylfluorene oxime was prepared. A mixture of 2-heptafluorobutanoylfluorene (17.26 g, 48 mmol), hydroxylamine hydrochloride (7.95 g, 114 mmol), and 60 mL of absolute ethanol was stirred magnetically and treated with 23 mL (286 mmol) of pyridine. The resulting solution was heated under nitrogen in an 80° C. oil bath for 18 h, then cooled to ambient temperature. Volatiles were removed at reduce pressure, and the residue was partitioned between 100 mL each of dichloromethane and 1 N hydrochloric acid. The organic layer was washed successively with water and with brine, dried over magnesium sulfate and filtered. A solution of 7 mL of concentrated hydrochloric acid in 50 mL of acetic acid was added, and the resulting mixture was stirred 18 h at ambient temperature. Water (100 mL) was added. The organic layer was separated, washed with brine, dried over magnesium sulfate, filtered, and concentrated to deposit an off-white solid. After recrystallization from heptane, 16.29 g (91% of theory) of this intermediate product was obtained.

Finally, 1-(9H-fluoren-2-yl)-heptafluoro-1-butanone-O-[(3-methacryloxypropyl)sulfonyl]oxime was prepared as follows. A stirred solution of 2-heptafluorobutanoylfluorene oxime (4.00 g, 10.6 mmol) and triethylamine (1.9 mL, 14 mmol) in 25 mL of dichloromethane under nitrogen was cooled in an ice bath and treated with a solution of 3-(chlorosulfonyl)propyl methacrylate (2.88 g, 13 mmol) in 10 mL of dichloromethane. The mixture was slowly warmed to ambient temperature, diluted with dichloromethane, and washed successively with 1 N hydrochloric acid and with brine. The organic layer was dried over magnesium sulfate, and filtered. A small amount of 4,4'-thiobis(2-methyl-6-tert-butylphenol) (inhibitor) was added, and the solution was concentrated at reduced pressure. The residue was recrystallized thrice from 2-propanol to provide 3.37 g of the desired product (56% of theory).

Photopolymer Preparations

Comparison 1

A mixture of 216.60 g (0.501 moles) 1H,1H,2H,2H-perfluorooctyl methacrylate ("FOMA"), 18.20 (0.128 moles) glycidyl methacrylate ("GMA"), and 4.702 g (0.0245 moles) 2-2'-azobis(2-methylbutyronitrile) in 685 g HFE-7600 was stirred under nitrogen for 18 hours at 78° C., then cooled to room temperature The reaction contents were drained, and the residue rinsed out with 1036.26 g additional HFE-7600 in three portions. The combined solutions provided a solution of the photopolymer containing 12 w/w % solids. The FOMA/GMA molar ratio was 79.7/20.3. Next, 1.0% by weight (relative to the copolymer) of photo-acid generator, CGI 1907 (2-[2,2,3,3,4,4,5,5-octafluoro-1-(nonafluorobutylsulfonyloxyimino)-pentyl]-fluorene, aka, ONPF) was added to the photopolymer solution. The solution was then filtered through a Mykrolis Optimizer filter with a pore size of 0.05 μm filter.

Comparison 2

In a manner analogous to Comparison 1, a photopolymer solution was prepared in HFE-6512 having 12 w/w % solids, but rather than adding CGI 1907 as the photo-acid generator, F7FSPMA was copolymerized to provide an attached photo-acid generator. The photopolymer had a FOMA/GMA/F7FSPMA molar ratio of 79/20/1. No sensitizing dye was provided.

Example 1

A mixture of 216.00 g (0.500 moles) FOMA, 18.20 g (0.128 moles) GMA, 4.863 g (0.0253 moles) 2-2'-azobis(2-methylbutyronitrile), and 3.60 g (0.013 moles) 9-anthracenemethanol methacrylate ("AMMA") in 685 g HFE-7600 was stirred under nitrogen for 18 hours at 78° C., then cooled to room temperature The reaction contents were drained, and the residue rinsed out with 1058.6 g additional HFE-7600 in three portions. The combined solutions provided a solution of the photopolymer containing 12 w/w % solids. The FOMA/GMA/AMMA molar ratios were 78.0/20.0/2.0. Next, 1.0% by weight (relative to the copolymer) of photo-acid generator, CGI 1907 was added to the photopolymer solution. The solution was then filtered through a Mykrolis Optimizer filter with a pore size of 0.05 μm filter.

Example 2

This example is like Example 1 except that the third monomer was "FOCMA". In a manner analogous to Example 1, a photopolymer solution was prepared in HFE-7600 having 12 w/w % solids. The FOMA/GMA/FOCMA molar ratio was 78/20/2. Photo-acid generator CGI 1907 was added to the solution at a level of 1.0% by weight, relative to the copolymer.

Example 3

This example is like Example 1 except that the third monomer was "DBCMA". In a manner analogous to Example 1, a photopolymer solution was prepared in HFE-6512 (rather than HFE-7600) having 12 w/w % solids. The FOMA/GMA/DBCMA molar ratio was 78/20/2. Photo-acid generator CGI 1907 was added to the solution at a level of 1.0% by weight, relative to the copolymer.

Example 4

This example is like Example 1 except that a portion of the FOMA was replaced with "TRIS" (compound (PR-3) shown above). The presence of TRIS can provide additional dry etch resistance. In a manner analogous to Example 1, a photopolymer solution was prepared in HFE-7600 having 12 w/w % solids. The FOMA/GMA/TRIS/AMMA molar ratio was 58/20/20/2. Photo-acid generator CGI 1907 was added to the solution at a level of 1.0% by weight, relative to the copolymer.

Example 5

This example is like Example 1 except that a portion of the FOMA was replaced with "ADMA" as shown below. The presence of ADMA can provide additional dry etch resistance

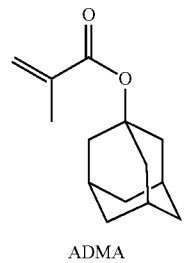

ADMA

In a manner analogous to Example 1, a photopolymer solution was prepared in HFE-6512 (rather than HFE-7600) having 12 w/w % solids. The FOMA/GMA/ADMA/AMMA molar ratio was 68/20/10/2. Photo-acid generator CGI 1907 was added to the solution at a level of 1.0% by weight, relative to the copolymer.

Example 6

This example is like Example 1 except that the amount of GMA relative to FOMA was increased. In a manner analogous to Example 1, a photopolymer solution was prepared in HFE-7600 having 12 w/w % solids. The FOMA/GMA/AMMA molar ratio was 58/40/2. Photo-acid generator CGI 1907 was added to the solution at a level of 1.0% by weight, relative to the copolymer.

Example 7

This example is like Example 1 except that a portion of the FOMA was replaced with "PFCMMA" as shown below.

PFCMMA provides an alternative fluorinated group relative to FOMA and may increase Tg.

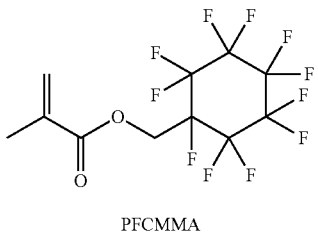 [SMILES: C=C(C)C(=O)OCC1(F)C(F)(F)C(F)(F)C(F)(F)C(F)(F)C1(F)F]

PFCMMA

In a manner analogous to Example 1, a photopolymer solution was prepared in HFE-6512 (rather than HFE-7600) having 12 w/w % solids. The FOMA/PFCMMA/GMA/AMMA molar ratio was 50/28/20/2. Photo-acid generator CGI 1907 was added to the solution at a level of 1.0% by weight, relative to the copolymer.

Example 8

In a manner analogous to Example 1, a photopolymer solution was prepared in HFE-6512 having 12 w/w % solids, but rather than adding CGI 1907 as the photo-acid generator, F7FSPMA was copolymerized to provide an attached photo-acid generator. The photopolymer had a FOMA/GMA/AMMA/F7FSPMA molar ratio of 77/20/2/1.

Example 9

In a manner analogous to Example 1, a photopolymer solution was prepared in HFE-7600 having 12 w/w % solids, but rather than adding CGI 1907 as the photo-acid generator, F8FSS was copolymerized to provide an attached photo-acid generator. The photopolymer had a FOMA/GMA/AMMA/F8FSS molar ratio of 77/20/2/1.

Example 10

This example is like Example 1 except that the third monomer was "TMJCMA". In a manner analogous to Example 1, a photopolymer solution was prepared in HFE-6512 (rather than HFE-7600) having 12 w/w % solids. The FOMA/GMA/TMJCMA molar ratio was 78/20/2. Photo-acid generator CGI 1907 was added to the solution at a level of 1.0% by weight, relative to the copolymer. TMJCMA is sensitive in the g-line region of a mercury lamp.

I-Line Photopatterning Evaluation

A silicon wafer was primed by vapor depositing HMDS. Each fluorinated photopolymer solution was spin coated onto the silicon wafer and then "soft baked" at 90° C. for 60 seconds. The photopolymer layer was about 1.0 to 1.5 μm thick. The photopolymer was exposed through a reticle to patterned UV radiation ("i-line", 365 nm) with doses ranging from 40 mJ/cm² to 880 mJ/cm², followed by post-exposure baking at 90° C. for 60 seconds. The exposed photopolymer was then developed to remove the unexposed portion and to form a photopolymer pattern on the substrate. The developing agent was either a mixture 97% by volume Novec™ 7300 and 3% by volume Novec™ 7600 ("A") or neat Novec™ 7600 ("B"). Developing agent A can be prepared, for example, by diluting 3 mL Novec™ 7600 with Novec™ 7300 to 100 mL. Two applications of developer (approximately 10 mL each) were provided onto the photopolymer layer to form a "puddle," and the dwell time of each application was noted. The wafer was spun dry at the end of each dwell time and the lithographic performance was evaluated, as shown in Table 1. In particular, the minimum dose to form a useful image was evaluated for each sample. The term "useful image" generally refers to the ability to form 5 micron lines. The remaining developed photopolymer of Examples 1-3 and 5-9 (Example 4 was not tested) were subjected to THF solvent treatments and the example photopolymers did not strip.

TABLE 1

| Photopolymer | # puddles - time each puddle | Developing agent | Minimum exposure dose to form useful image (mJ/cm²) |
| --- | --- | --- | --- |
| Comparison 1 | 2 - 45 s | A | >880 (no image formed) |
| Example 1 | 2 - 45 s | A | 100 |
| Example 2 | 2 - 45 s | A | 341 |
| Example 3 | 2 - 10 s | A | <40 |
| Example 4 | 2 - 45 s | A | 82 |
| Example 5 | 2 - 20 s | B | 68 |
| Example 6 | 2 - 20 s | B | <40 |
| Example 7 | 2 - 20 s | B | <40 |
| Comparison 2 | 2 - 30 s | A | >880 (no image formed) |
| Example 8 | 2 - 30 s | A | 243 |
| Example 9 | 1 - 20 s; 1 - 10 s | A | 103 |

The data in Table 1 show that the examples with integrated sensitizer have improved photo-speed, i.e., the minimum exposure energy dose needed to achieve a good developed image is lower than that for the photopolymer not having the integrated sensitizer. In addition, the developed photopolymer is very stable against solvents that are normally quite aggressive at stripping developed photopolymers.

G-Line Photopatterning Evaluation

A film of polymer Example 10 was prepared on a silicon wafer in a manner similar to Examples 1-9, except exposures were carried out using a g-line filtered stepper tool, rather than i-line, and in dose range of 50 mJ/cm² to 900 mJ/cm². Images were developed using one (1) 45 sec puddle of developer A. It was found that images held at and above an exposure energy of 218 mJ/cm². Although not specifically tested at g-line, it is believed that Comparison 1 (no sensitizing dye) will not form an image under these conditions. The only photo-active light-absorbing component in Comparison 1 is the PAG that absorbs at wavelengths well below i-line (365 nm), and g-line (436 nm) is even further outside the spectral absorbance of the PAG. Since i-line exposure of Comparison 1 did not form an image, g-line will not either. Thus, the presence of the sensitizing dye of Example 10 shows improved and useful photosensitivity, even at g-line.

The invention has been described in detail with particular reference to certain preferred embodiments thereof, but it will be understood that variations, combinations, and modifications can be effected by a person of ordinary skill in the art within the spirit and scope of the invention.

LIST OF REFERENCE NUMBERS USED IN THE DRAWINGS 2 form photopolymer layer on substrate step
4 form exposed photopolymer layer step
6 form developed structure step
10 substrate
12 organic semiconductor material layer
14 gate dielectric material layer
16 source electrode 18 drain electrode
20 gate electrode
200 OLED backplane
201 support
202 TFT layer portion
203 patterned fluorinated photopolymer
210 first bottom electrode
211 well
212 red-emitting organic EL medium
220 second bottom electrode
221 well
222 green-emitting organic EL medium
230 third bottom electrode
231 well
232 blue-emitting organic EL medium
240 common top electrode
250 active matrix OLED device

The invention claimed is:

1. A photosensitive composition comprising:
    a fluorinated solvent;
    a photo-acid generator; and
    a copolymer comprising at least three distinct repeating units, including a first repeating unit having a fluorine-containing group, a second repeating unit having an acid-catalyzed cross-linkable group, and a third repeating unit having a sensitizing dye.

2. The photosensitive composition of claim 1 wherein the copolymer has a total fluorine content in a range of 15 to 60% by weight.

3. The photosensitive composition of claim 1 wherein the acid-catalyzed cross-linkable group is an epoxide.

4. The photosensitive composition of claim 1 wherein the fluorine-containing group is a fluoroalkyl.

5. The photosensitive composition of claim 1 wherein the solvent is a hydrofluoroether.

6. The photosensitive composition of claim 1 wherein the sensitizing dye is a coumarin or anthracene having a light absorption peak in a range of 300 to 450 nm.

7. The photosensitive composition of claim 1 wherein the photo-acid generator is non-ionic and has one or more fluorine atoms.

8. The photosensitive composition of claim 1 wherein the photo-acid generator is covalently attached to the copolymer, which further comprises a photo-acid generating repeating unit.

9. The photosensitive composition of claim 8 wherein the photo-acid generating repeating unit is selected so that, upon activation of the photo-acid generator, an acid portion remains attached to the copolymer and a release portion includes a fluorinated group.

10. A method of patterning a device, comprising:
    forming a photopolymer layer on a device substrate, the photopolymer layer including a photo-acid generator and a copolymer, wherein the copolymer comprises at least three distinct repeating units, including a first repeating unit having a fluorine-containing group, a second repeating unit having an acid-catalyzed cross-linkable group, and a third repeating unit having a sensitizing dye;
    exposing the photopolymer layer to patterned radiation to form an exposed photopolymer layer; and
    contacting the exposed photopolymer layer with a developing agent to remove unexposed photopolymer, thereby forming a developed structure having a first pattern of exposed photopolymer covering the substrate and a complementary second pattern of uncovered substrate corresponding to the unexposed photopolymer.

11. The method of claim 10 wherein the developing agent comprises at least 50% by volume of a hydrofluoroether solvent.

12. The method of claim 10 wherein the device substrate comprises a support and a layer of active organic material, and wherein the photopolymer layer is in contact with the layer of active organic material.

13. The method of claim 10 wherein the first pattern of photopolymer forms at least a portion of a gate dielectric in an organic thin film transistor device.

14. The method of claim 10 wherein the first pattern of photopolymer forms a plurality of wells capable of containing a display material.

15. The method of claim 14 further comprising providing display material into one or more of the plurality of wells, wherein the display material is a color filter material, a liquid crystal material, an electrophoretic material, an organic light-emitting material or a semiconductor nanoparticle material.

16. The method of claim 10 wherein the first pattern of photopolymer forms at least a portion of a barrier layer in a water sensitive or bioelectronic device.

17. The method of claim 10 wherein the photo-acid generator is covalently attached to the copolymer, which further comprises a photo-acid generating repeating unit.

18. An article comprising a layer of a copolymer having at least three distinct repeating units, including a first repeating unit having a fluorine-containing alkyl group, a second repeating unit having an alkyl ether group that is cross linked to an alkyl ether group of another second repeating unit, and a third repeating unit having a sensitizing dye that has a light absorption peak in a range of 300 to 450 nm, wherein the copolymer has a total fluorine content in a weight range of 15 to 60%.

19. The article of claim 18 wherein the article is an organic thin film transistor device, an OLED device, a display device, a bioelectronic device or a lighting device.

* * * * *